United States Patent [19]

Brozovich et al.

[11] 4,408,158
[45] Oct. 4, 1983

[54] FREQUENCY TRANSDUCER

[75] Inventors: Roy S. Brozovich, Oldsmar; Prentice G. Moore, Clearwater, both of Fla.

[73] Assignee: Square D Company, Palatine, Ill.

[21] Appl. No.: 308,767

[22] Filed: Oct. 5, 1981

[51] Int. Cl.³ .............................................. G01R 23/02
[52] U.S. Cl. ................................ 324/78 R; 324/83 R
[58] Field of Search ................ 324/78 R, 83 A, 78 D, 324/83 R, 83 D, 78 Z, 79 R, 79 D, 85; 328/133; 364/484

[56] References Cited

U.S. PATENT DOCUMENTS

| | | | |
|---|---|---|---|
| 3,594,637 | 7/1971 | Beckwith | 324/78 R |
| 3,652,933 | 3/1972 | Rubner | 324/83 A |
| 3,893,009 | 7/1975 | Watson | 324/83 A |
| 4,321,529 | 3/1982 | Simmonds | 324/83 R |

*Primary Examiner*—Michael J. Tokar
*Attorney, Agent, or Firm*—Michael J. Femal; Richard T. Guttman

[57] ABSTRACT

A frequency transducer for monitoring frequency in a power line wherein a frequency representative signal is generated which is twice the frequency of the signal to be monitored in the power line, the frequency representative signal is shaped into a triggering output signal which is supplied as one input to a comparator in a comparator/timer circuit. A second input to the comparator is provided by a timing circuit which produces a reference signal as that second input, said reference signal having a constant non-zero duration, the magnitude of which is dependent upon the timing constant of a resistive-capacitive circuit; said resistive-capacitive circuit being charged by a constant charging current of high value to ensure that variances in the timing constant due to temperature, humidity, contamination and the like are small when considered as a percentage figure. Switching means within the comparator/timer circuit are responsive to the output of the comparator in that circuit to drive the comparator/timer circuit and to produce a stabilized frequency representative signal which is then averaged and amplified to produced an averaged frequency representative DC signal directly proportional to the frequency of the signal carried by the power line.

7 Claims, 4 Drawing Figures

FREQUENCY TRANSDUCER

BACKGROUND OF THE INVENTION

In today's complex electronic systems, one of the primary objectives is accuracy of performance as well as speed of performance. Often times, the accuracy of performance of a given electronic application is directly related to the stability of various parameters of the source of power for that system. One such parameter which can significantly affect accuracy of performance of an electronic system is the stability of the frequency of the input power to that system. It is desirable that there is a capability to continuously monitor input frequency and to either indicate an exceeding of limits of input frequency by such means as meters or alarms or by employing the indicator signal as a feedback signal to a device to automatically adjust the input frequency back toward the desired value. Such monitoring of input frequency is readily accomplished by use of a frequency transducer. A frequency transducer converts AC input frequency into a DC signal which is zero at a given frequency (generally at that frequency which is desired on the input line) and varies from zero proportionally with the variance of the input frequency from the desired frequency. The direction of variance, positive or nagative, of the DC output indicates whether the frequency variance is toward a higher frequency or toward a lower frequency.

Most frequency transducers in the art employ some sort of timer circuit as part of the transducing scheme. By and large, these time circuits employ an RC (resistive-capacitive) circuit. One source of inaccuracy with such RC circuits is the shunting effect across the capacitor because of leakage caused by increased humidity, circuit board contamination and the like. Such a shunting effect can significantly alter the time constant of the RC circuit and thereby significantly adversely affect the accuracy of the output of the transducer. There is little one can do to alter the magnitude of the change in time constant due to the shunting effect of the capacitor under conditions of increased humidity, however, the present invention significantly lessens the impact of that shunting effect. The shunting effect across the capacitor is nearly constant for a given temperature-humidity condition. The present invention recognizes that fact and is designed to lessen the impact of that inaccuracy by providing a higher charging current for the capacitor in the RC circuit thereby rendering that constant inaccuracy a smaller percentage of the charging current so that the time constant is effectively more stable and the accuracy of the transducer is thereby enhanced.

It is, therefore, an object of this invention to provide a frequency transducer of significantly greater accuracy by ensuring that the effects upon the RC circuit and the timer portion of the transducer occasioned by changes in temperature and humidity are a small percentage of the charging current applied to that RC circuit. The inaccuracies occasioned by the shunting effect across capacitor in the RC circuit because of temperature-humidity conditions is, therefore, recognized as a design criteria and the design of the present invention recognizes that elimination of that error is impractical yet aims at minimizing its effects upon the accuracy of the output of the invention.

Another problem which has been encountered in the design of frequency transducers is the meeting of industry established standards of a peak-to-peak variance of AC ripple signal superimposed upon the DC output signal which is less than 1% of the full scale DC signal output and a less than 400 millisecond response time to changes in frequency of the input from the power line monitored.

It is, therefore, another objective of this invention to provide a frequency transducer which will more easily and more consistently meet the above recited industry standards.

Further objects and features of the present invention will be apparent from the following specification and claims when considered in connection with the accompanying drawings illustrating the preferred embodiment of the invention.

SUMMARY OF THE INVENTION

The invention is a frequency transducer in which input is taken from a power line to be monitored and a power representative signal is generated at twice the frequency of the signal present on the power line to be monitored. The power representative signal is then fed through a wave-shaping circuit to produce a triggering output signal equal in frequency to the power representative signal, which triggering output signal is fed to a comparator/timer circuit. The comparator/timer circuit is comprised of a timing circuit, a comparator circuit and a switching means, all of which cooperate to produce a stabilized frequency representative signal which has a generally squarewave shape, the positive portion of which has a constant duration and the negative portion of which varies proportionally with the frequency of the input from the power line to be monitored. This stabilized frequency representative signal is then integrated and amplified to produce an averaged frequency representative signal which is a DC signal proportional to the frequency of the input from the power line to be monitored and which is zero when the frequency on the power line to be monitored is at the desired value and varies from zero as the frequency on the power line to be monitored varies from its desired value, the direction of variance (positive or negative) of the averaged frequency representative signal indicates the direction of the variance of the frequency of the input from the power line to be monitored (i.e., variance above the desired frequency or below the desired frequency). The approach of processing a power representative signal equal to twice the frequency of the frequency of the input from the power line to be monitored provides two benefits; (1) it facilitates the meeting of industry established standards for frequency transducers that such transducers have a peak-to-peak variance of AC ripple signal superimposed upon the DC output signal which is less that 1% of the full scale DC signal output and that such transducers have less than a 400 millisecond response time to changes in frequency of the input from the power line to be monitored; and, (2) the higher frequency of the power representative signal processed by the transducer permits the employment of a shorter time constant RC circuit in the timing circuit of the comparator/timer circuit so that a higher charging current can be applied to that RC circuit and the shunting effect across the capacitor occasioned by temperature-humidity conditions, which is essentially constant for given conditions of temperature-humidity, amounts to a significantly lesser percentage of the charging current than is present in prior art devices so that inaccuracies in the output signal of the transducer are significantly reduced.

Moreover, the capacitive component of the RC circuit in the timing circuit is in a feedback circuit of an operational amplifier so that the capacitive component is charged by a constant charging current which further ensures that the effects of shunting across the capacitive components are lessened.

Figure 1:
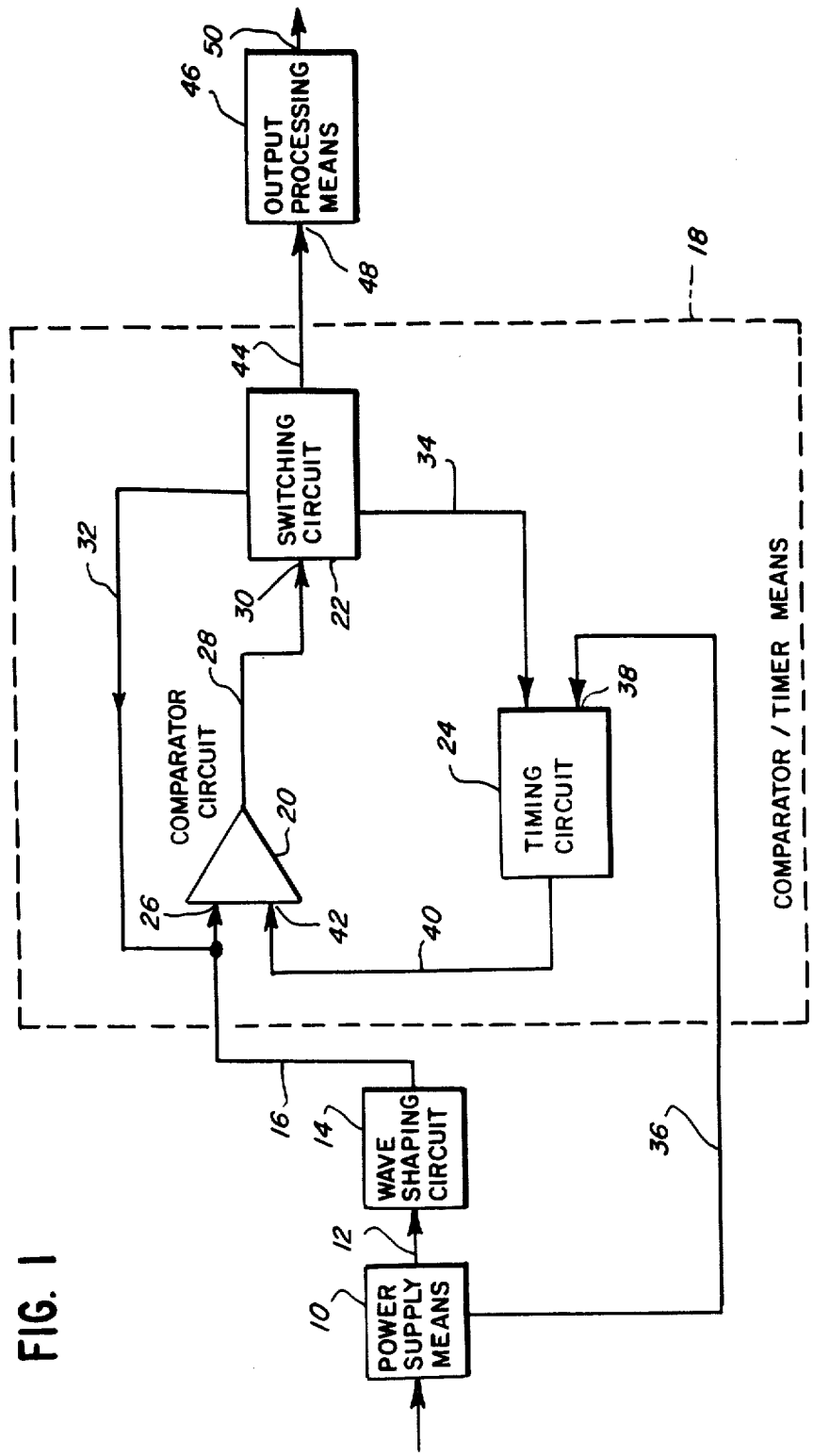
FIG. 1 is a block diagram of the present invention.

In describing the preferred embodiment of the invention illustrated in the drawings, specific terminology will be resorted to for the sake of clarity. However, the invention is not intended to be limited to these specific terms so selected and it is to be understood that each specific term contains all technical equivalents which operate in a similar manner to accomplish a similar purpose. For example, the terms "connected" or "coupled" may include connection through other circuit elements wherein such connection is recognized as equivalent and operates in essentially the same manner to accomplish the same purpose.

DETAILED DESCRIPTION

A frequency transducer is a device for sensing the frequency in a power line and processing that frequency to produce an averaged frequency representative signal which is a DC signal proportional to the frequency present in the power line monitored by the transducer.

FIG. 1 is a block diagram of the basic components of a frequency transducer according to the present invention. Referring to FIG. 1, a power supply 10 provides various operating voltages (not shown) to the components of the frequency transducer. Additionally, the power supply 10 provides a power representative signal represented by a line 12 to a wave-shaping circuit 14. The power representative signal 12 is a signal with a frequency equal to twice the frequency of a signal on the power line monitored by the transducer. The wave-shaping circuit 14 processes the power representative signal 12 to produce a triggering output signal at 16, which triggering output signal has the same frequency as the power representatives signal at 12. The output 16 of the wave-shaping circuit 14 is connected to a comparator/timercircuit 18 as an input. The comparator/timer 18 is comprised of a comparator circuit 20, a switching means 22 and a timing circuit 24. The output 16 of the wave-shaping circuit 14 is applied to an input 26 of the comparator circuit 20. An output 28 of the comparator circuit 20 is a frequency representative signal and is used in producing three signals: (1) the switching means responds to the frequency representative signal in switching between two stable voltages to produce a stabilized frequency representative signal and applies that signal along a line 32 to the input 26 of the comparator circuit 20; (2) the frequency representative signal drives the on/off function of the timing circuit 24 via a line 34; and, (3) the stabilized frequency representative signal is applied at a line 44 as an output of the comparator/timer means 18 to an input 48 of an output processing means 46.

The timing circuit 24 receives a constant voltage signal along a line 36 from the power supply 10. The constant voltage signal is applied to an input 38 of the timing circuit 24. The timing circuit 24 produces as an output a reference signal along a line 40 to a second input 42 of the comparator circuit 20. The output processing means 46 integrates the stabilized frequency representative signal over time, and amplifies that signal to produce an averaged frequency representative signal at its output 50. The output 50 of the output processing circuit 46 is the output of the transducer and is a DC signal proportional to the frequency of the input from the power line monitored by the transducer.

Figure 2:
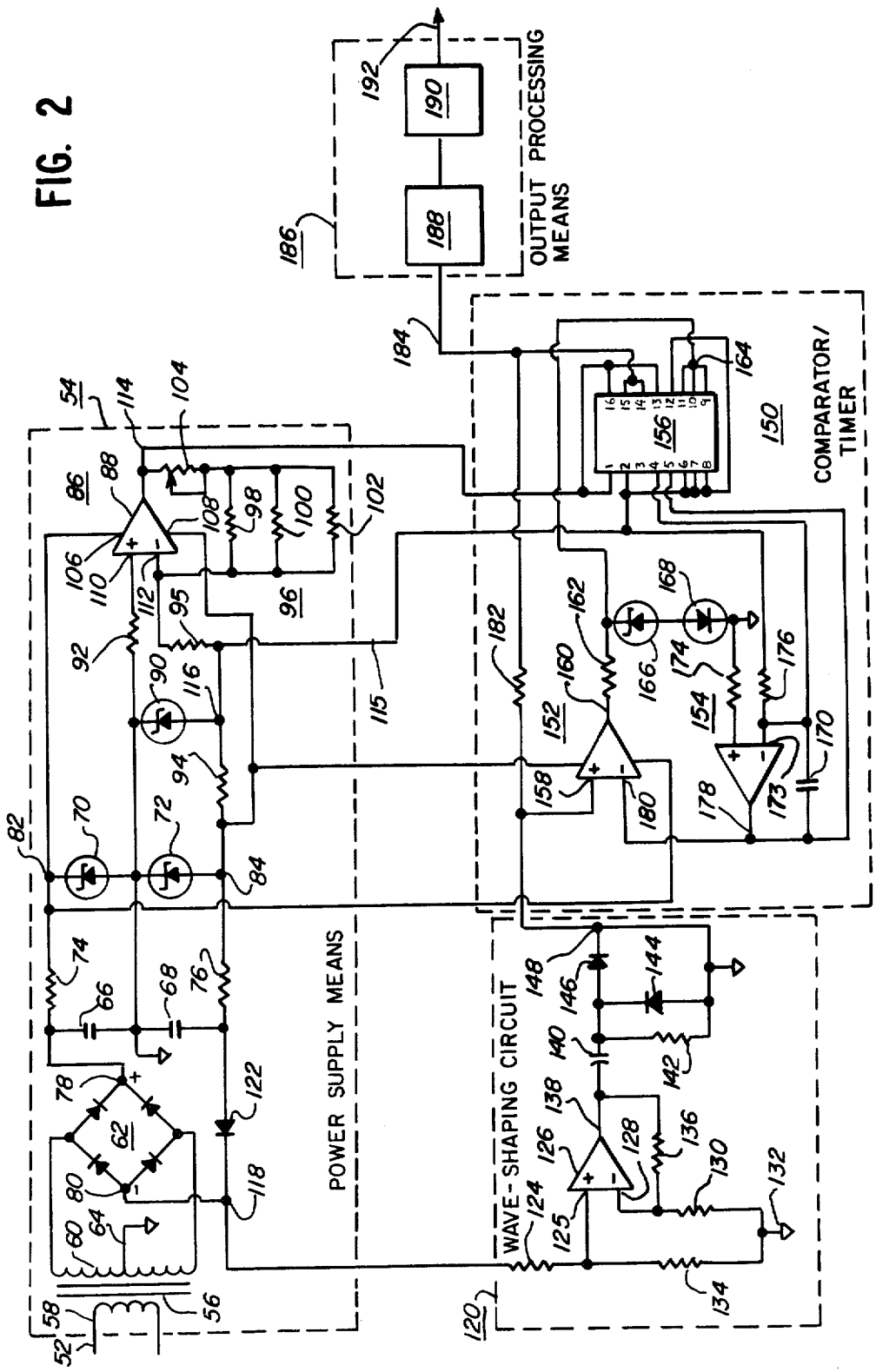
FIG. 2 is a schematic diagram representing the improved frequency transducer of the present invention.

FIG. 2 is a detailed schematic diagram of the transducer shown in block diagram in FIG. 1. Referring to FIG. 2, the power line monitored by the transducer provides an input 52 to a power supply 54. The power supply 54 receives the input 52 via a transformer 56 having a primary 58 and a secondary 60. A fullwave rectifier bridge 62 is connected across the secondary 60 of the transformer 56. A center tap to ground 64 is connected to the secondary 60 of the transformer 56. A voltage divider circuit comprised of capacitors 66 and 68, zener diodes 70 and 72 and resistors 74 and 76, is connected across a positive node 78 and a negative node 80 of the fullwave rectifier bridge 62. Thus, a positive operating voltage for operational amplifiers in the transducer is available at a point 82, and a negative supply voltage for operational amplifiers within the transducer is available at a point 84. An inverter circuit 86 comprised of an operational amplifier 88; a temperature compensated zener diode 90; resistors 92, 94, and 95, and a feedback resistive network 96 which is further comprised of resistors 98, 100, 102 and variable resistor 104. The operational amplifier 88 receives supply voltages at terminals 106 and 108, and receives its positive input at a terminal 110 and its negative input at a terminal 112. The purpose of the inverter circuit 86 is to provide the positive and negative stable reference voltages which are selected by the switching means 22 in response to the frequency representative signal to produce the stabilized frequency representative signal which is the output 44 of the comparator/timer means 18 in FIG. 1. The positive stable reference voltage is provided at an output 114 of the inverter circuit 86 and the negative stable reference voltage is provided at the negative side of the temperature compensated zener diode 90 at a point 116. The feedback resistive network 96, through adjustment of the variable resistor 104, provides the zero adjust capability to ensure that the averaged frequency representative signal, which is the output 50 of the output processing means 46 in FIG. 1, is at zero when the frequency in the power line monitored by the transducer is at the desired value. The output from the power supply 10 to the wave-shaping circuit 14 in FIG. 1 is found in FIG. 2 as a connection from the negative node 80 of the fullwave rectifier bridge 62 at a point 118 to supply to a wave-shaping circuit 120 a fullwave rectified negative signal (the power representative signal) which has a frequency equal to twice the frequency of the signal applied to the input 52 of the power supply 54. Within the power supply 54, there is an isolation diode 122 to ensure the purity of the signal from point 118 to the wave-shaping circuit 120.

The wave-shaping circuit 120 receives the power representative signal via a resistor 124 to an input 125 of an operational amplifier 126. Resistor 134 serves as a voltage dividing resistor to set the proper voltage level at input 125 of operational amplifier 126, and resistors 130 and 136 provide a feedback circuit to establish the gain of operational amplifier 126. Thus, operational amplifier 126 provides an output 138 which is applied to an AC coupling capacitor 140. AC coupling capacitor 140 serves to shift output 138 in a positive direction and applies that shifted signal to a clamping circuit comprised of resistor 142 and diodes 144 and 146, which clamping circuit removes negative portions of the shifted signal to provide a triggering output signal at point 148 in the shape of a sharp positive spike of brief duration occasioned by each zero value of the negative full wave rectified power representative signal received from point 118 via resistor 124 at input 125 of operational amplifier 126.

A comparator/timer circuit 150 is comprised of a comparator circuit 152, a timing circuit 154 and a switching means 156. The comparator/timer circuit 150 receives the triggering output signal from the wave-shaping circuit 120 at an input 158 of the comparator circuit 152. An output 160 of the comparator circuit 152 is applied via resistor 162 to an input 164 of the switching means 156. The output 160 applied at the input 164 of the switching circuit 156 serves to drive the switching circuit 156 in its operation as a pair of parallel-driven single pole, double throw switches to select a positive reference voltage provided by the output 114 of the inverter circuit 86 when the output 160 of the comparator circuit 152 is positive and to select a negative reference voltage supplied by line 115 from the power supply 54 when the output 160 of the comparator circuit 152 is negative. The zener diodes 166 and 168 serve to clamp the output 160 at a proper level to prevent damage to the switching means 156. The switching means 156 is an analog multiplexer/demultiplexer of a type commonly known in industry, such as a CD 4053, which is employed as a triple single pole, double throw switch. Two of the single pole, double throw switches are parallel-driven by the output 160 of the comparator circuit 152 as described immediately above. The third of the three single pole, double throw switches within the switching means 156 is likewise driven by the output 160 of the comparator circuit 152 to open across a capacitor 170 when the output 160 is positive and to close across the capacitor 170, thereby shorting around capacitor 170, when the output 160 is negative. The timing circuit 154 is comprised of an operational amplifier 172, resistors 174 and 176, and the capacitor 170. A stable reference voltage is applied via line 115 from power supply 54 through a resistor 176 to the negative input 173 of operational amplifier 172. The stability of this reference voltage input to the operational amplifier 172 is significant in that its stability directly affects the accuracy of the transducer as shall be later described in detail. An output 178 of the timing circuit 154 is provided as a reference signal to an input 180 of the comparator circuit 152. Feedback resistor 182 connects the output 160 of the comparator circuit 152 to the input 158 of the comparator circuit 152 via the switching means 156, thus feeding back to input 158 of comparator circuit 152 the stabilized frequency representative signal. The comparator circuit 152 compares the output of the wave-shaping circuit 120 which is applied to the input 158 of the comparator circuit 152 and the feedback applied at input 158 via resistor 182 with the reference signal applied at input 180 to produce the output 160, as shall be described in detail later.

Returning to consider the switching means 156 in more detail, the switching means 156 is provided with sixteen connection terminals, which terminals are connected as indicated by the following table:

| PIN NO. | CONNECTED TO PIN NO. |
| --- | --- |
| 1 | 16, 13 |
| 2 | 6, 7, 8, 12 |
| 3 | — |
| 4 | — |
| 5 | — |
| 6 | 2, 7, 8, 12 |
| 7 | 2, 6, 8, 12 |
| 8 | 2, 6, 7, 12 |
| 9 | 10, 11 |
| 10 | 9, 11 |
| 11 | 9, 10 |
| 12 | 2, 6, 7, 8 |
| 13 | 1, 16 |
| 14 | 15 |
| 15 | 14 |
| 16 | 1, 13 |

The output of the comparator/timer circuit 150 is the output at line 184 from pins 14 and 15 of the switching means 156. The output at line 184 is provided as an input to the output processing means 186. The output processing means 186 is comprised of a filter 188 of a type well known in the art and an amplifier 190 also of a type well known in the art. The function of the output processing means 186 is to integrate over time and amplify the output 184 of the comparator/timer circuit 150. The output processing means 186 thus provides an output at 192 which is an averaged frequency representative signal proportional to the frequency of the power line signal present at the input 52 to the power supply 54.

Figure 3:
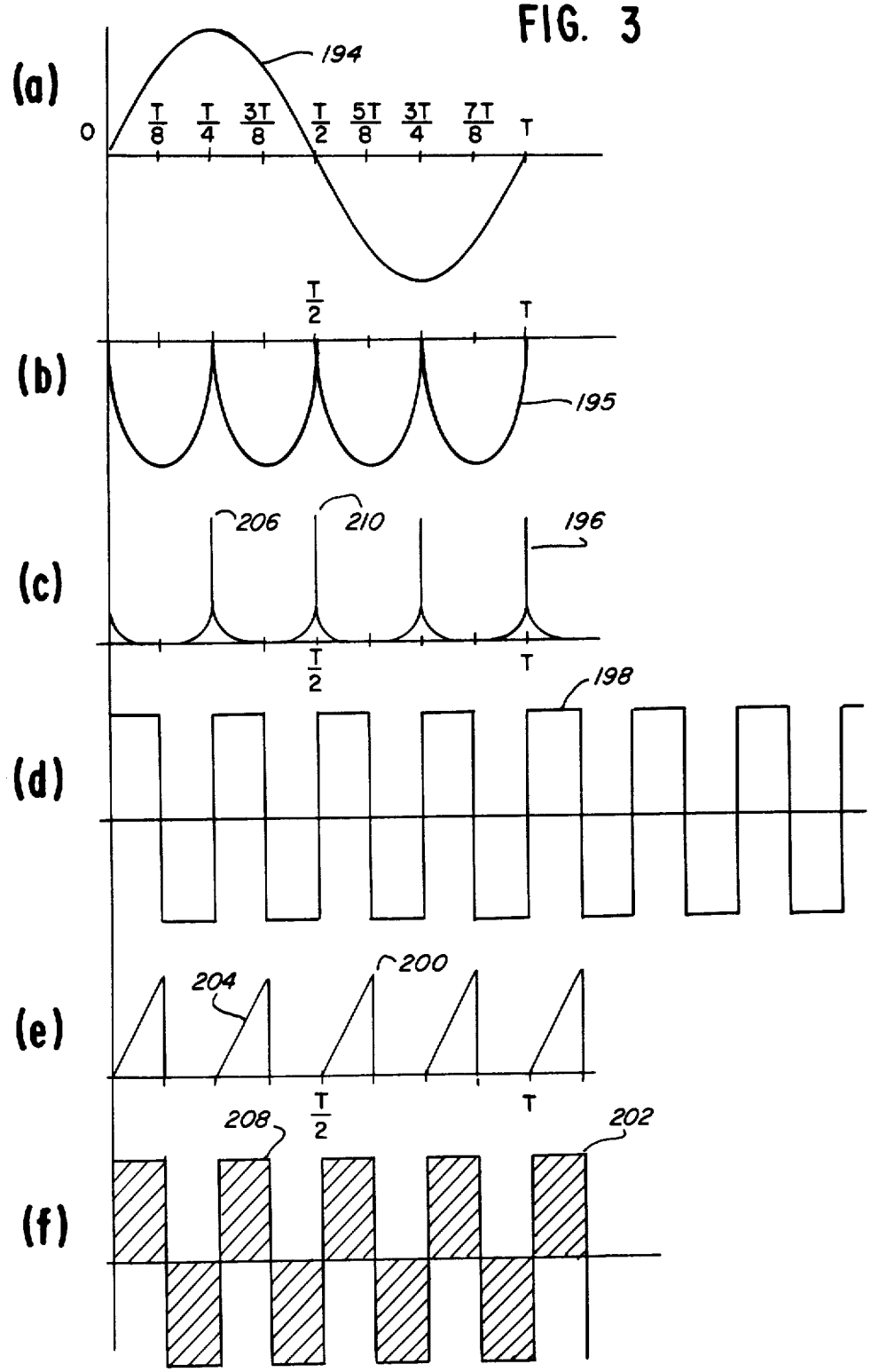
FIG. 3(a-f) is a representation of various waveforms present at locations within the frequency transducer when the frequency of the input from the power line to be monitored is at the desired value.

Turning now to FIG. 3, the operation of the invention shall be explained; reference shall be made to FIG. 2 during the course of this explanation.

In FIG. 3(a), curve 194 represents the signal applied to the power line and, consequently, is the signal applied at the input 52 of the power supply 54 in FIG. 2. In FIG. 3(b), the curve 195 represents the power representative signal produced by the power supply 54 and supplied as an input to the wave-shaping circuit 120 at the input 125 of the operational amplifier 126. In FIG. 3(c), curve 196 represents the triggering output signal produced by the wave-shaping circuit 120 and provided as an input to comparator/timer circuit 150 at the input 158 of the comparator circuit 152. In FIG. 3(d), curve 198 represents the frequency representative signal which is the output 160 of the comparator circuit 152 of the comparator/timer circuit 150. In FIG. 3(e), curve 200 represents the reference signal which is the output 178 of the operational amplifier 172 of the timing circuit 154 within the comparator/timer circuit 150. This reference signal 178 is provided as an input to the input terminal 180 of the comparator circuit 152. In FIG. 3(f), curve 202 represents the stabilized frequency representative signal which is the output 184 of the comparator/timer circuit 150. FIGS. 3(a-f) are shown on a common horizontal time scale to better illustrate the relationship among these various signals over a given time span as they appear in the circuitry of the present invention. It is worthy to note that the power representative signal 195 has a frequency of twice the frequency of the power line signal 194. Similarly, the triggering output signle 196 has a frequency equal to twice the frequency of the power line signal 194. Given a power line signal 194 of frequency F and a period of T (as illustrated in FIG. 3(a)) with zero crossings at time=-zero, T/2, and T for each cycle, which power line signal 194 is applied to the input 52 of the power supply 54, the power supply 54 produces as an output a power representative signal 195 (as illustrated in 3(b) of frequency 2F. This power representative signal 195 is a full wave rectified signal having zero crossings at time=-zero, T/4, T/2, 3T/4 and T for a given cycle of the power line signal 194. The power representative signal 195 is applied to the input 125 of the operational amplifier 126 of the wave-shaping circuit 120. The wave-shaping circuit 120 produces as an output a triggering output signal 196 which is shaped as a series of spikes occurring at time=zero, T/4, T/2, 3T/4, and T for a given cycle of the power line signal 194. The triggering output signal 196 is applied as an input to input 158 of the comparator circuit 152 of the comparator/timer circuit 150. The comparator 152 produces as an output the frequency representative signal 198 which is a substantially squarewave signal and which is fed back via the switching means 156 to the input 158 of the comparator 152. Reference signal 200 is produced at output 178 of the operational amplifier 172 of the timing circuit 154 and is applied at input 180 of comparator circuit 152. As the constant charging voltage, provided from the power supply 54 via line 115 and resistor 176, charges the capacitor 170, the output 178 of the operational amplifier 172 is automatically maintained at a potential which will ensure a constant charging current is applied to capacitor 170. The switching means 156 maintains an open circuit in parallel with capacitor 170 thereby allowing capacitor 170 to charge so long as the frequency representative signal 198 is positive. As the capacitor 170 charges, the ramp 204 of the reference signal 200 occurs at output 178 of the operational amplifier 172 and is the input provided at input 180 of the comparator circuit 152. I shall begin my explanation of the relationship of the various curves depicted in FIG. 3 at the occurrence of a "spike" 206 as shown in FIG. 3(c). On the occurrence of a spike 206, the comparator 152 changes state so that the frequency representative signal 198 becomes positive as shown by a comparison of FIGS. 3(c) and 3(d). When the frequency representative signal 198 becomes positive, the switching means 156 opens the circuit through its terminals 4 and 5 in parallel with the capacitor 170 thereby allowing capacitor 170 to begin to charge. The capacitor 170 is charged by the constant charging current provided by the power supply 54 through line 115 in concert with the feedback characteristics of operational amplifier 172 as described above. As the capacitor 170 charges, the ramp 204 of the reference signal 200 begins to build. The ramp 204 continues to build and, therefore, the level of the input signal at input 180 of the comparator circuit 152 continues to build until the amplitude of the ramp 204 equals the amplitude of the stabilized frequency representative signal 202 such as at point 208 in FIG. 3(f). When the amplitude of the ramp 204 equals the amplitude of the stabilized frequency representative signal 202 at point 208, the comparator circuit 152 changes state so that the frequency representative signal 198 becomes negative. When the frequency representative signal 198 becomes negative, the switching means 156 closes the circuit between its terminals 4 and 5 in parallel with the capacitor 170 thereby shorting out that capacitor and dropping the reference signal 200 to zero. The comparator circuit 152 remains in that state with the frequency representative signal 198 at its negative level and the reference signal 200 at zero until the next occurrence of a spike 210 in FIG. 3(c). Occurrence of the spike 210 triggers the comparator circuit 152 to change states so that the above-described cycle begins again. The switching means 156 is driven by the frequency representative signal 198 in such a manner that when the frequency representative signal 198 is positive, the switching circuit 156 produces at line 184 a positive reference voltage of 6.2 volts which is provided by the power supply 54 and, when the frequency representative signal 198 is negative, the switching means 156 provides at line 184 a negative reference voltage of −6.2 volts, also provided by the power supply 54. This −6.2 volt signal produced at line 184 is the stabilized frequency representative signal 202 in FIG. 3(f). The curves depicted in FIGS. 3(a–f) illustrate the situation present in the present invention when the power line signal 194 is at a frequency at which the transducer has been adjusted to produce a zero output; that is, the positive and negative half cycles of the stabilized frequency representative signal 202 are equal in duration and amplitude.

Figure 4:
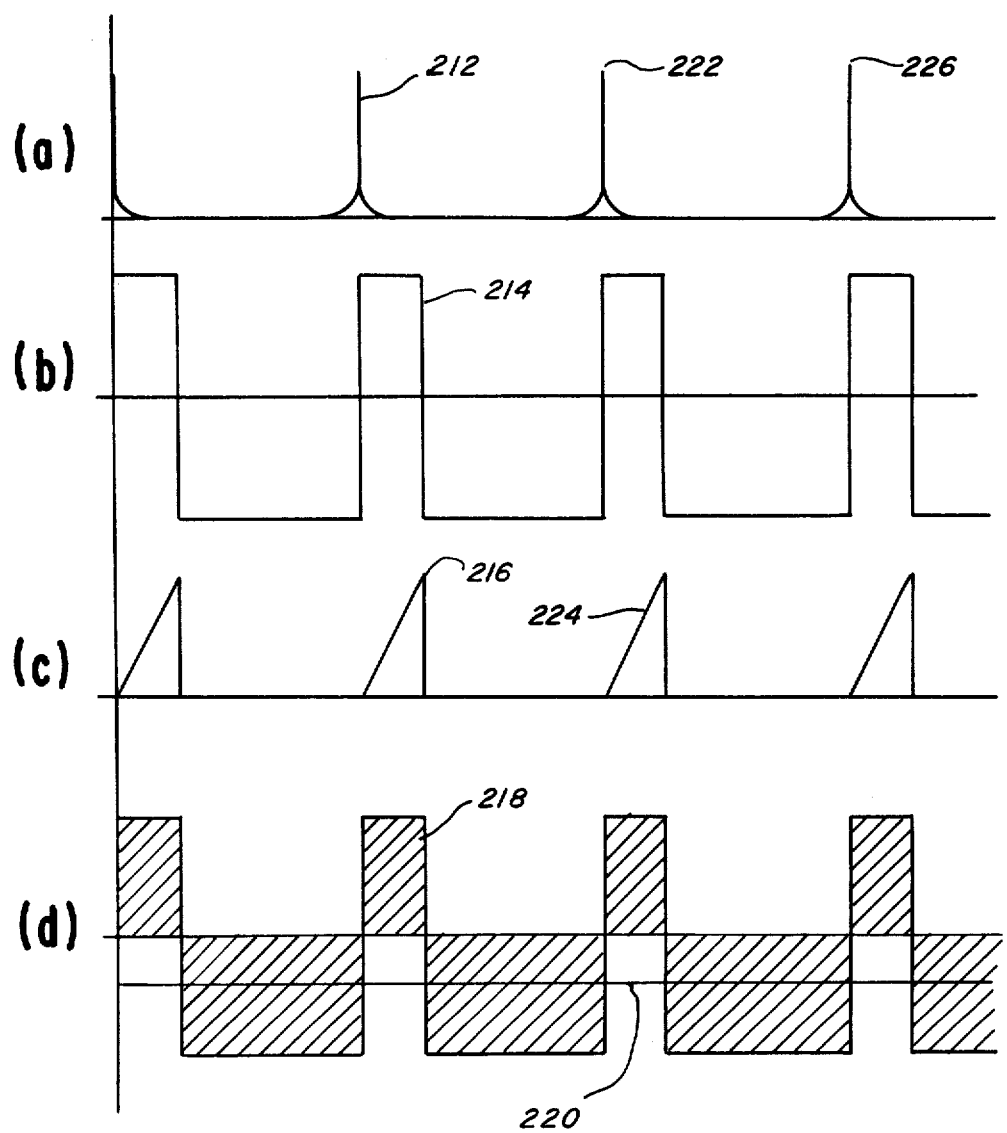
FIG. 4(a-d) is a representation of various waveforms present at locations within the frequency transducer when the frequency of the input from the power line to be monitored is below the desired value.

FIGS. 4(a–d) illustrate the relationships among various signals within the present invention when the power line signal applied at input 52 of the power supply 54 is below the frequency at which the transducer is adjusted for a zero output. In FIG. 4(a), curve 212 represents the triggering output signal which is the output of the wave-shaping circuit 120 applied as an input at input 158 of comparator circuit 152. In FIG. 4(b), curve 214 represents the frequency representative signal which is present at the output 160 of the comparator circuit 152. In FIG. 4(c), curve 216 represents the reference signal present at output 178 of the operational amplifier 172 of the timing circuit 154. In FIG. 4(d), curve 218 represents the stabilized frequency representative signal which is the output of the comparator/timer circuit 150 provided at line 184 in FIG. 2. Also in FIG. 4(d), curve 220 represents the averaged frequency representative signal which is the output provided by the frequency transducer at point 192 in FIG. 2. The present invention, when operating in the state producing curves as illustrated in FIGS. 4(a–d), operates in the same manner as under conditions as described in discussing FIG. 3. It is worthy of note that the reference signal 216 in FIG. 4(a) is of the same non-zero duration as the reference signal 200 in FIG. 3(e). The reason for this is that the time constant of the RC circuit comprised of resistor 176 and capacitor 170 remains unchanged regardless of the frequency of the power line signal 194 in FIG. 4(a) applied at the input 52 of the power supply 54. Thus, it can be seen that the positive portion of the frequency representative signal 214 is of the same duration as the positive portion of the frequency representative signal 198, and the positive portion of the stabilized frequency representative signal 218 is the same as the positive portion of the stabilized frequency representative signal 202. The difference between the two situations occurs because of the lower frequency of the triggering output signal 212 as compared to the frequency of the triggering output signal 196. It may be recalled that, once the frequency representative signal becomes negative, the switching means 156 creates a short circuit in parallel with the capacitor 170 thus dropping the reference signal 216 to zero, and, simultaneously, the frequency representative signal 214 goes to its negative value, and the two signals will remain in those states until the next occurrence of a spike 222, as shown in FIG. 4(a). The occurrence of the spike 222 causes the comparator 152 to change state, thereby causing the frequency representative signal 214 to become positive. Upon the frequency representative signal's 214 becoming positive, the switching circuit 156 opens the circuit in parallel with the capacitor 170 thereby allowing the capacitor 170 to begin charging and building the ramp 224 in FIG. 4(c). When the ramp 224 reaches an amplitude equal to the value of the stabilized frequency representative signal 218, the comparator circuit 152 again changes state to cause the frequency representative signal to become negative which causes the switching means 156 to close the short circuit in parallel with the capacitor 170 thereby dropping the reference signal 216 to zero, and, simultaneously, the frequency representative signal 214 goes to its negative value. The frequency representative signal 214 remains negative, and the reference signal 216 remains at zero thereafter awaiting the arrival of the next spike 226. It can be seen from a comparison of the stabilized frequency representative signal 218 and the stabilized frequency representative signal 202 of FIG. 3(f) that the positive portions of those two signals are the same since the non-zero portion of the respective reference signals, 216 and 200, are constant; this is because the timing constant determined by the resistor 176 and the capacitor 170 is constant irrespective of the frequency of the power line signal applied at input 52 of the power supply 54. The negative portion of the stabilized frequency representative signal 202 in FIG. 3(f) is equal to the positive portions of that signal so that the averaged frequency representative signal in the situation depicted by FIG. 3, that is, in the situation where the power line signal 194 is at the desired frequency, is equal to zero. In the low frequency situation depicted by FIG. 4, however, the averaged frequency representative signal 220 is less than zero, since the negative portion of the stabilized frequency representative signal 218 is of much longer duration than the positive portion of that signal. Thus, the DC output of the transducer at 192 in FIG. 2, being less than zero, indicates that the frequency of the signal at the input 52 of the power supply 54 is below the desired frequency, and the amount by which the averaged frequency representative signal 220 is below zero is indicative of how much the frequency of the signal at the input 52 of the power supply 54 is below the desired frequency.

Of noteworthy importance is the feature of the present invention which provides a constant charging current to the capacitor 170. A constant voltage is provided to the timing circuit 154 from the power supply 54 via line 115, as shown in FIG. 2. Since the capacitor 170 is in the feedback circuit of operational amplifier 172, the operational amplifier 172 automatically adjusts the potential of its output 178 so that capacitor 170 is charged by a constant charging current. Since the charging current charging capacitor 170 is a constant value, the reference signals 200 and 216 appear as ramp functions rather than exponential curves as is the case in prior art devices. It is well known in the art that temperature, humidity, contamination, and other effects upon capacitors are fairly constant regardless of the amount of charging current used to charge the capacitor. Thus, the timing circuit 154 of the present invention will suffer the same magnitude of error in its timing circuit 154 as would other devices in the prior art using capacitors and resistors in their timing circuits of the same characteristics as resistor 176 and capacitor 17. The key point is that, since the charging current passing through resistor 176 to charge capacitor 170 is relatively high compared to prior art devices and since employment of a constant charging current provides a ramp function as opposed to an exponential curve function, the percentage impact of those given errors for a given source of inaccuracy is significantly less than is the case with the prior art devices. Consequently, from a percentage viewpoint, which is the common measure of accuracy of devices of this type, the present invention is significantly more accurate than prior art devices.

We claim:

1. A transducer for monitoring frequency in a power line comprising:
   a. power supply means for supplying operating and reference voltages to various components of the transducer and for producing a power representative signal and a constant voltage signal, said power supply means being connected to said power line and receiving input therefrom, and said power representative signal having a frequency which is a multiple of the frequency of the input from the power line;
   b. wave shaping means for producing a triggering output signal equal in frequency to the frequency of said power representative signal, said wave shaping means being connected to said power supply means and receiving said power representative signal as input;
   c. comparator/timer means for producing a frequency representative signal, said comparator/timer means further comprising:
      (1) switching means for switching between two of said reference voltages in response to a frequency representative signal to produce a stabilized frequency representative signal, and for providing on-off status control of a timing means, said switching means receiving said frequency representative signal as an input, and producing said stabilized frequency representative signal as an output;
      (2) timing means for providing a reference signal, said timing means' on-off status being controlled by said switching means, said timing means being connected to said switching means and to said power supply means, and receiving said constant voltage signal from said power supply means; and,
      (3) comparator means for comparing said triggering output signal and said stabilized frequency representative signal at a first input with said reference signal at a second input for producing said frequency representative signal, said comparator means being connected to said wave shaping means and receiving said triggering output signal as an input therefrom, connected to said switching means, and receiving said stabilized frequency representative signal as a feedback input therefrom, connected to said timing means and receiving said reference signal as an input therefrom, and connected to said switching means, and providing said frequency representative signal as an output thereto; and, d. output processing means for producing an averaged frequency representative signal which is proportional to the frequency of the input from the power line, said output processing means being connected to said switching means of said comparator/timer means and receiving the stabilized frequency representative signal as input.

2. A transducer for monitoring frequency in a power line as recited in claim 1 wherein the multiple of the frequency of the input from the power line is two.

3. A transducer for monitoring frequency in a power line as recited in claim 1 wherein the reference signal has a non-zero portion of constant duration.

4. A transducer for monitoring frequency in a power line as recited in claim 1 wherein the output processing means is a filter/amplifier for averaging and amplifying the stabilized frequency representative signal to produce an averaged frequency representative signal which is proportional to the frequency of the input from the power line.

5. A transducer for monitoring frequency in a power line as recited in claim 1 wherein said timing means includes a resistive-capacitive means and an amplifying means with a capacitive component of said resistive-capacitive means in a feedback circuit of said amplifying means so that said capacitive component is charged with a constant charging current.

6. A method for monitoring frequency in a power line comprising:

a. generating of a power representative signal equal to a multiple of the frequency in the power line;

b. forming the power representative signal into a triggering signal with a frequency equal to the frequency of the power representative signal;

c. generating of a reference signal of constant non-zero duration;

d. comparing the triggering signal and the reference signal to produce a frequency representative signal with a positive portion equal in duration to the non-zero duration of the reference signal and with a negative portion which varies in duration with the frequency of the triggering signal;

e. selectively switching between two reference voltages in response to said frequency representative signal to produce a stabilized frequency representative signal with positive and negative durations thereof being respectively substantially the same as are present in the frequency representative signal, but with its upper and lower amplitude limits equal to the two reference voltages selectively switched; and, f. averaging the stabilized frequency representative signal over time to produce an averaged frequency representative signal which is proportional to the frequency in the power line.

7. A method for monitoring frequency in a power line as recited in claim 5 wherein the multiple of the frequency in the power line is two.

* * * * *